United States Patent [19]
Fuji

[11] Patent Number: 5,604,725
[45] Date of Patent: Feb. 18, 1997

[54] INFORMATION RECORDING METHOD AND COLLECTOR AND DISTRIBUTOR FOR RECORDING INFORMATION

[75] Inventor: Hiroshi Fuji, Soraku-gun, Japan

[73] Assignee: Sharp Kabushiki Kaisha, Osaka, Japan

[21] Appl. No.: 357,203

[22] Filed: Dec. 13, 1994

[30] Foreign Application Priority Data

Dec. 16, 1993 [JP] Japan .................................. 5-316125
Dec. 16, 1993 [JP] Japan .................................. 5-316127

[51] Int. Cl.$^6$ ............................................. G11B 5/09
[52] U.S. Cl. ...................... 369/275.3; 341/50; 341/51; 360/40; 360/49; 369/59
[58] Field of Search .................. 369/44.37, 59, 369/275.01, 275.03; 360/40, 48, 49; 341/50, 51, 55, 59

[56] References Cited

U.S. PATENT DOCUMENTS

| | | | |
|---|---|---|---|
| 5,274,510 | 12/1993 | Sugita | 360/49 |
| 5,333,126 | 7/1994 | Fukuda | 369/59 |
| 5,418,657 | 5/1995 | Machado | 360/40 |
| 5,473,591 | 12/1995 | Abe | 369/59 |

FOREIGN PATENT DOCUMENTS

| | | |
|---|---|---|
| 2-31330 | 2/1990 | Japan . |
| 2-247837 | 10/1990 | Japan . |
| 4-341974 | 11/1992 | Japan . |

*Primary Examiner*—David C. Nelms
*Assistant Examiner*—Son Mai
*Attorney, Agent, or Firm*—Nixon & Vanderhye, P.C.

[57] ABSTRACT

A coding method for an information recording/reproduction apparatus and a recording medium, comprising the step of setting a second code bit of a second track adjacent to a first code bit of a first track in the direction perpendicular to a track to "0" or "nonmark" when the first code bit of the first track is "1" or "record mark.", wherein a first coding rule for obtaining a first code bit on an odd track and a second coding rule for obtaining a second code bit on an even track are used and a second bit adjacent to a first bit in the direction perpendicular to a track is set to "0" or "nonmark" by the second coding rule when the first code bit is "1" or "record mark".

4 Claims, 17 Drawing Sheets

| DATA | EVEN TRACK | ODD TRACK |
|------|------------|-----------|
| 0 | 0 0 0 | 0 0 1 |
| 1 | 0 1 0 | 1 0 0 |

| DATA | EVEN TRACK | ODD TRACK |
|------|------------|-----------|
| 0 0 | 0 0 0 0 | 0 0 0 0 |
| 0 1 | 0 0 0 1 | 0 1 0 0 |
| 1 0 | 0 0 1 0 | 1 0 0 0 |
| 1 1 | 0 0 1 1 | 1 1 0 0 |

| ADDITIONAL BIT FOR EACH BYTE | EVEN TRACK | ODD TRACK |
|---|---|---|
| | 10 | 01 |

| DATA | EVEN TRACK | ODD TRACK |
|---|---|---|
| 0 0 0 | 0 0 0 0 0 0 0 1 | 0 0 0 0 0 0 1 0 |
| 0 0 1 | 0 0 0 0 0 1 0 1 | 0 0 0 0 1 0 1 0 |
| 0 1 0 | 0 0 0 1 0 0 0 1 | 0 0 1 0 0 0 1 0 |
| 0 1 1 | 0 0 0 1 0 1 0 1 | 0 0 1 0 1 0 1 0 |
| 1 0 0 | 0 1 0 0 0 0 0 1 | 1 0 0 0 0 0 1 0 |
| 1 0 1 | 0 1 0 0 0 1 0 1 | 1 0 0 0 1 0 1 0 |
| 1 1 0 | 0 1 0 1 0 0 0 1 | 1 0 1 0 0 0 1 0 |
| 1 1 1 | 0 1 0 1 0 1 0 1 | 1 0 1 0 1 0 1 0 |

ADDITIONAL BIT     ADDITIONAL BIT (30 TYPES)

FIG. 10

|   |   |   |
|---|---|---|
| 0 | 0 | 0 |
| 0 | 0 | 0 |
| 1 | 0 | 0 |
| 1 | 0 | 0 |
| 0 | 1 | 0 |
| 0 | 0 | 1 |

MULTIBEAM

FIG. 11

|   |   |   |
|---|---|---|
| 0 | 0 | 0 |
| 0 | 0 | 0 |
| 1 | 0 | 0 |
| 1 | 0 | 0 |
| 0 | 1 | 0 |
| 0 | 0 | 1 |

MULTIBEAM

| INFORMATION BIT | MODULATION BIT |
|---|---|
| 0 1 | × 0 0 |
| 1 0 | 0 1 0 |
| 1 1 | × 0 1 |
| 0 0 0 1 | × 0 0 0 0 1 |
| 0 0 1 0 | × 0 0 0 0 0 |
| 0 0 1 1 | 0 1 0 0 0 1 |
| 0 0 0 0 | 0 1 0 0 0 0 |

THE SYMBOL "×" TAKES A SIGN OPPOSITE
TO THAT OF THE PRECEDING MODULATION BIT.

FIG. 14
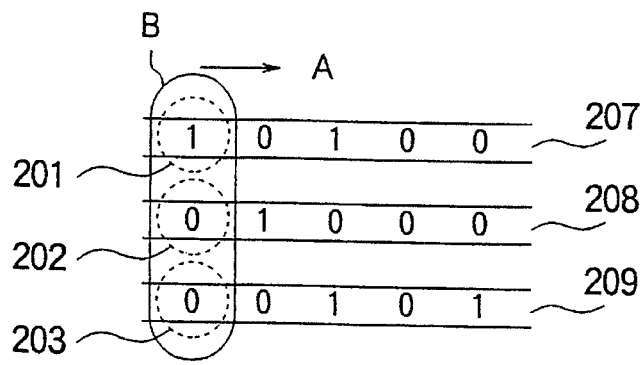
FIG. 15
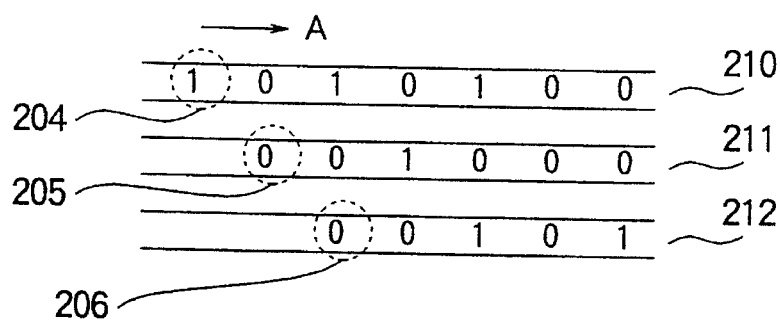
FIG. 16
| INFORMATION BIT | SIGN BIT |
|---|---|
| 0 1 | × 0 1 |
| 1 0 | 0 1 0 |
| 1 1 | × 0 1 |
| 0 0 0 1 | × 0 0 0 0 1 |
| 0 0 1 0 | × 0 0 0 0 0 |
| 0 0 1 1 | 0 1 0 0 0 1 |
| 0 0 0 0 | 0 1 0 0 0 0 |
THE SYMBOL "×" TAKES A SIGN OPPOSITE TO THAT OF THE PRECEDING SIGN BIT.

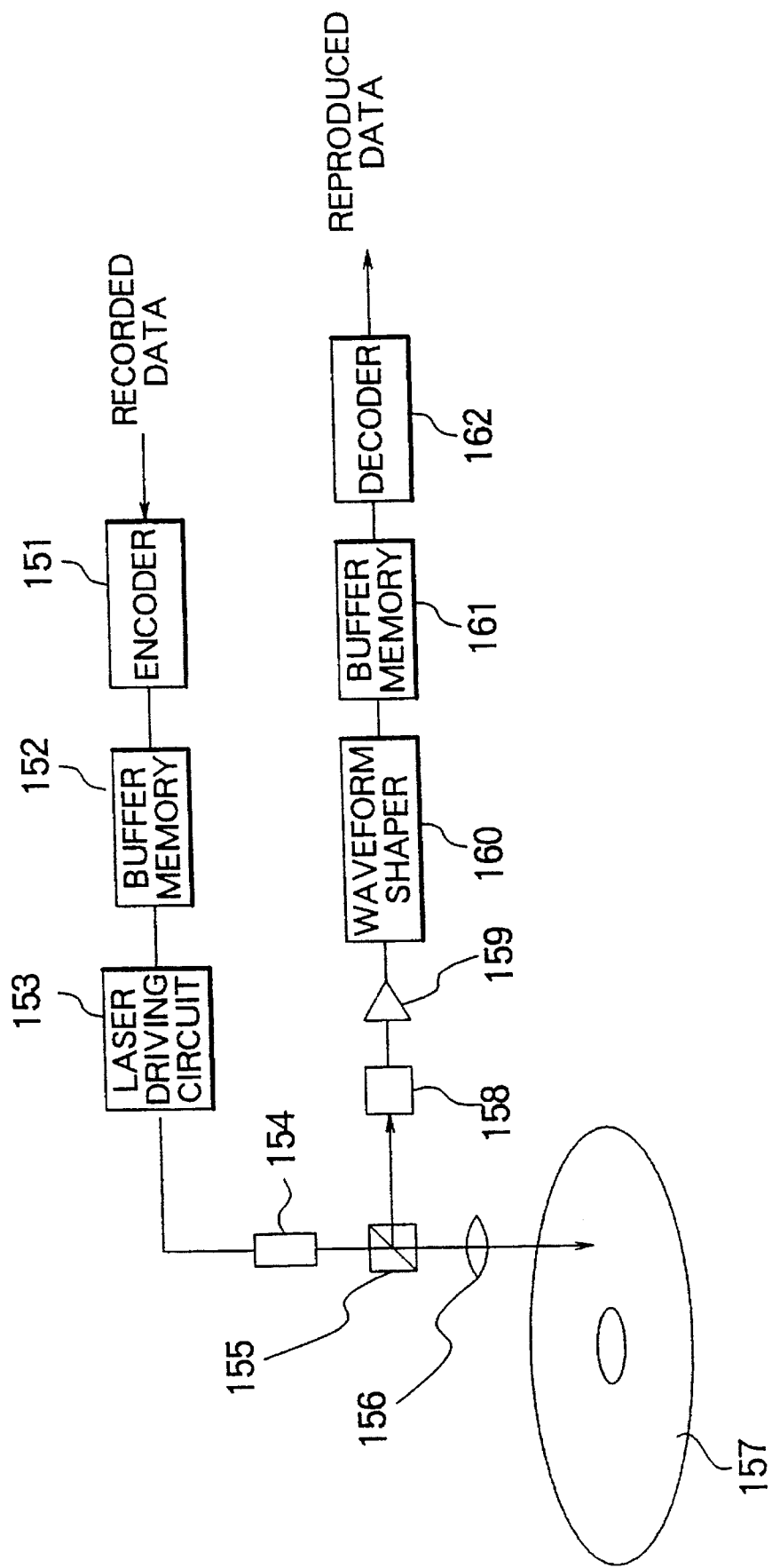

INFORMATION RECORDING METHOD AND COLLECTOR AND DISTRIBUTOR FOR RECORDING INFORMATION

BACKGROUND OF THE INVENTION

1. Field of the Invention

The present invention relates to an information recording/reproduction apparatus for converting an information bit to a code bit in order to record information on a recording medium at a high density and to a coding method suitable to the recording medium.

The present invention further relates to an information recording method for recording and reproducing information in and from a multibeam recording/reproduction apparatus and a recording medium at high speed.

2. Description of the Related Art

The first embodiment of the prior art is the optical memory disclosed in Japanese Patent Publication No. 2-31330. In the case of this embodiment, an information bit is converted to a code bit by the so-called run length limited (RLL) code to record the code bit along a track. FIG. 12 shows a well-known (1, 7) RLL code conversion table. As shown in FIG. 13, for example, code bits according to the conversion rule and moreover converted by the so-called NRZ (nonreturn-to-zero) recording are serially recorded along a track 101. Recording for tracks 102 and 103 is performed in the same way.

The second embodiment of the prior art is the multibeam recording/reproduction apparatus disclosed in Japanese Patent Application laying open No. 2-247837. In the case of this embodiment, a first read signal is reproduced from a code bit by a first light beam, a second read signal is reproduced from a code bit of an adjacent track by a second light beam, and the second read signal is subtracted from the first read signal in order to decrease crosstalk caused by the adjacent tracks.

The third embodiment of the prior art is an information signal recording/reproduction apparatus disclosed in the official gazette as Japanese Patent Application No. laying open 4-341974. In the case of this embodiment, a video format signal is divided into three channel video signals and recorded by three multibeams.

However, when recording is performed in accordance with the coding rule of the first embodiment of the prior art, a reproduction error occurs due to crosstalk caused by adjacent tracks 102 and 103. For example, at the position of light spot A. "1" or "record mark" is read and no crosstalk occurs because the adjacent tracks 102 and 103 are "0" or "nonmark." This embodiment performs so-called NRZ recording by causing "1" to correspond to "record mark" and "0" to correspond to "nonmark."

However, the code of the adjacent track 103 is "1" for light spot B and the code bits of both the adjacent tracks 102 and 103 are set to "1" for light spot C. Crosstalk therefore occurs and causes a reproduction error.

To solve the above problem, the second embodiment of the prior art decreases crosstalk by using the above method. However, the second light beam necessarily reads the code bit of its adjacent track. Therefore, crosstalk also occurs in the second read signal due to its adjacent track and crosstalk cannot be completely eliminated even if the second read signal is subtracted from the first read signal.

A multibeam recording/reproduction apparatus has recently been proposed which records or reproduces data by using a plurality of light beams at high speed. The multibeam recording/reproduction apparatus simultaneously records or reproduces data for a plurality of sectors even though a single-beam recording/reproduction apparatus can record or reproduce data for only one sector at a time.

However, because data is conventionally recorded by the recording method of the first embodiment of the prior art, even the multibeam recording/reproduction apparatus requires the recording or reproduction time for one sector in order to record or reproduce data for one sector. That is, in the case of recording or reproducing data for a number of sectors equal to or fewer than the number of beams, it becomes impossible to increase the operation speed. Moreover, it is a matter of course that the recording or reproduction time for at least one byte is necessary to record or reproduce data for one byte. That is, the same applies to the case of recording or reproducing data for a number of bytes equal to or fewer than the number of beams.

The third embodiment of the prior art divides a video signal into three channels and records or reproduces data with three light beams. However, the dividing method or digital data for a computer is not disclosed at all. Moreover, because a discrimination signal is recorded on different time bases of adjacent tracks, it remains difficult to shorten the time for recording/reproduction a piece of video information.

SUMMARY OF THE INVENTION

To solve the above problems, the present invention is characterized by setting the second code bit of the second track adjacent to the first code bit in the direction perpendicular to a track to "0" or "nonmark" when the first code bit of the first track is "1" or "record mark".

Moreover, the present invention is characterized by including the first coding rule for obtaining the first code bit on an odd track and the second coding rule for obtaining the second code bit on an even track and setting the second code bit adjacent to the first code bit in the direction perpendicular to a track to "0" or "nonmark" in accordance with the second coding rule where the first code bit is "1" or "record mark" in accordance with the first coding rule.

Furthermore, the present invention is characterized by converting one-dimensional information bits before coding to a two-dimensional code bit matrix $\{Ci, Rj\}$ i=1, ..., m; j=1, ..., n) shown by an m×n matrix consisting of m bits in the direction of a track and n bits in the direction perpendicular to the track and, moreover, setting at least one of the $\{Ci, Rj-1\}$ and $\{Ci, Rj+1\}$ to "0" or "nonmark" when causing the matrix element $\{Ci, Rj\}$ correspond to "1" or "record mark".

Furthermore, the present invention is characterized by arranging code words having at least one "0" or "nonmark" between converted "1" or "record mark" and the next "1" or "record mark" in the direction perpendicular to a track and setting a second code bit of a second track adjacent to a first code bit of a first track in the direction perpendicular to the track to "0" or "nonmark" when the first code bit of the first track is "1" or "record mark".

Furthermore, the present invention relates to a multibeam recording/reproduction apparatus and an information recording method for an optical recording medium, characterized by recording one byte of code words or one code word on a plurality of tracks.

Furthermore, the present invention relates to a multibeam recording/reproduction apparatus and an information recording method for an optical recording medium, characterized in that information is recorded separately on a plurality of recording tracks by assuming the least common multiple between n light beams and m code bits obtained by converting a plurality of informational words or the number of bits integer times larger than the least common multiple as one block.

The present invention also relates to a multibeam recording/reproduction apparatus and an information recording method for an optical recording medium, characterized by recording information for one sector on a plurality of recording tracks.

When a code bit to be read is "1" or "record mark," the present invention makes it possible to set a code bit perpendicularly adjacent to the code bit to be read to "0" or "nonmark." Therefore, because the code bit of ar adjacent track can be sat to "nonmark," crosstalk of a read signal does not occur, even if a light beam reads the code bit, and thus it is possible to provide a coding method causing no reproduction error. Particularly in the case of a multibeam recording/reproduction apparatus, a synchronized code bit can easily be recorded or reproduced, therefore providing a preferable advantage. Moreover, even when every "1" or "record mark" is replaced with "0" or "nonmark" in the above embodiment, the same advantage can be obtained. Even though a coding method causing no crosstalk due to either of the adjacent tracks is the most advantageous, it is possible to obtain a great advantage by even a coding method for removing only crosstalk due to either adjacent track.

The same advantage can be obtained by the present invention even when it is applied to an optical recording/reproduction apparatus including a magneto-optical disk recording/reproduction apparatus, a recording/reproduction apparatus such as a card or tape, or an additional-recording-type or a phase-change-type optical recording/reproduction apparatus.

Moreover, the present invention makes it possible to decrease the time for recording or reproducing data for one byte or one word to 1/(number of beams) compared to the existing case and therefore greatly decrease the recording or reproduction time for one byte or one word. That is, it is possible to shorten the recording/reproduction time by a value equivalent to the increase in the number of beams.

Particularly in the case of an optical recording/reproduction apparatus capable of increasing its capacity when the track pitch becomes about 1 to 2 μm, it is necessary to transfer a great deal of data and therefore it is possible to realize higher speed transfer of data by the present invention.

Moreover, when the number of bits for one byte or one word cannot be divided by the number of light beams without a remainder or when the number of light beams cannot be divided by the number of bits for one byte or one word without a remainder, it is also possible to record information separately on a plurality of recording tracks by assuming the least common multiple between a light beams and m bit code words obtained by converting a plurality of informational words as one block.

Furthermore, it is possible to greatly shorten the time for recording or reproducing data for one sector because the time is decreased to 1/(number of beams) compared to the existing case.

That is, it is possible to shorten the recording/reproduction time by a value equivalent to the increase in the number of beams.

The same advantage can be obtained by the present invention even when it is applied to an optical recording/reproduction apparatus including a magneto-optical disk recording/reproduction apparatus, a recording/reproduction apparatus such as a card or tape, or an additional-recording-type or a phase-change-type recording/reproduction apparatus.

Further objects and advantages of the present invention will be apparent from the following description of the preferred embodiments of the present invention as illustrated in the accompanying drawings.

BRIEF DESCRIPTION OF THE DRAWINGS

FIG. 8 is an illustration showing a geometric pattern of the two-dimensional code-bit matrix according to the fourth embodiment of the present invention;

Figures 10, 11:
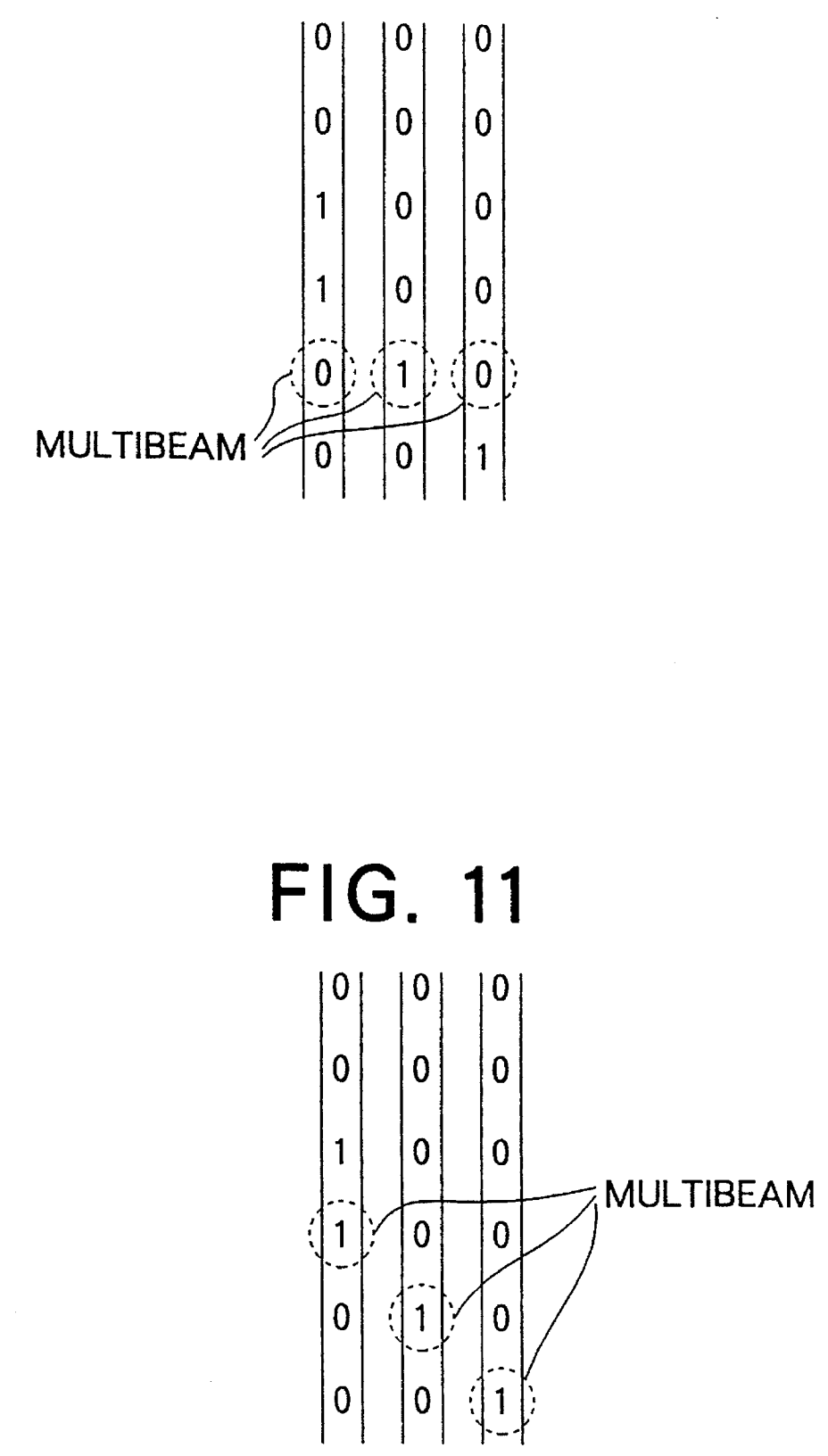

FIG. 10 is an illustration showing recordation of code bits.

FIG. 11 is an illustration showing recordation of code bits.

FIG. 14 is an illustration for explaining an information recording method according to the sixth embodiment of the present invention;

FIG. 15 is an illustration showing an information recording method according to the seventh embodiment of the present invention;

FIG. 16 is an illustration showing a conversion table of (1, 7) RLL code which is an example of code code;

FIG. 22 is a block diagram of the information recording/reproduction apparatus of the first embodiment of the present invention;

DESCRIPTION OF THE PREFERRED EMBODIMENTS

Figures 1, 2, 3:
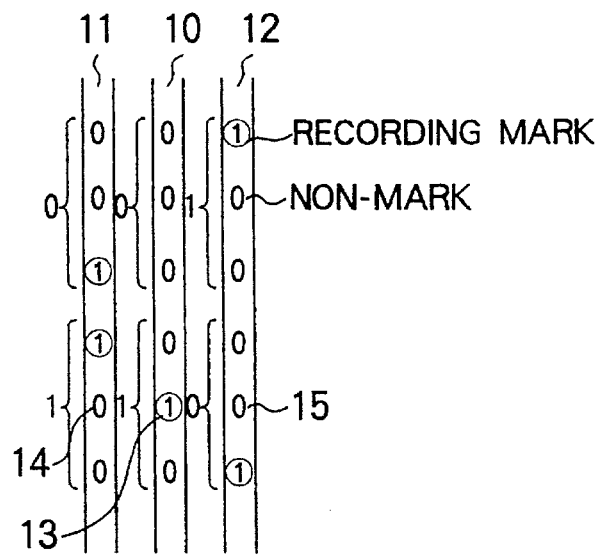
FIG. 1 is an illustration showing a code conversion table according to the first embodiment of the present invention.
FIG. 2 is an illustration showing code bits recorded in accordance with the code conversion table in FIG. 1.
FIG. 3 is an illustration showing a code conversion table according to the second embodiment of the present invention.

The information recording/reproduction apparatus of the present invention is described below by taking an optical recording/reproduction apparatus as an example.

FIG. 22 is an illustration showing the optical recording/reproduction apparatus of the present invention. When information is recorded, information bits (record data) are input to an encoder 151 where encoding is performed for three tracks and modulation bits (code bits or code words) are temporarily stored in a buffer memory 152. When a light beam is tracked by the first track, modulation bits to be recorded on the first track are first output from the buffer memory. When the light beam is tracked by the second track and then the third track, a modulation bit to be recorded on the second track and a modulation bit to be recorded on the third track are output in order from the buffer memory. These modulation bits are sent to a laser driving circuit 153. The driving current is sent to a semiconductor laser 154 from the laser driving circuit 153 and a light beam is applied to an optical disk 157 through a beam splitter 155 and an objective lens 156 and the modulation bits are recorded on the first, second, and third tracks in order.

When information is reproduced, the light reflected from record bits recorded on the optical disk 157 is led to a photodetector 158 by bending the optical rath of the reflected light by using the beam splitter 155 through the objective lens 156. A reproduction signal converted to an electric signal is amplified by an amplifier 159 and converted to a digital signal of "1" or "0" by a waveform shaper. The reproduction bits of the first track are first stored in a buffer memory 161 from the first track. Then, the reproduction bits of the second track and the third track are stored in the buffer memory 161 from the second and third track, in this order. The reproduction bits stored on the three tracks are demodulated into an information bit by a decoder 182. In the above description, one light beam is used. However, when three light beams are used, the above two buffer memories 152 and 161 are unnecessary because information can be recorded on or reproduced from the first, second, and third tracks at the same time.

Figure 22A:
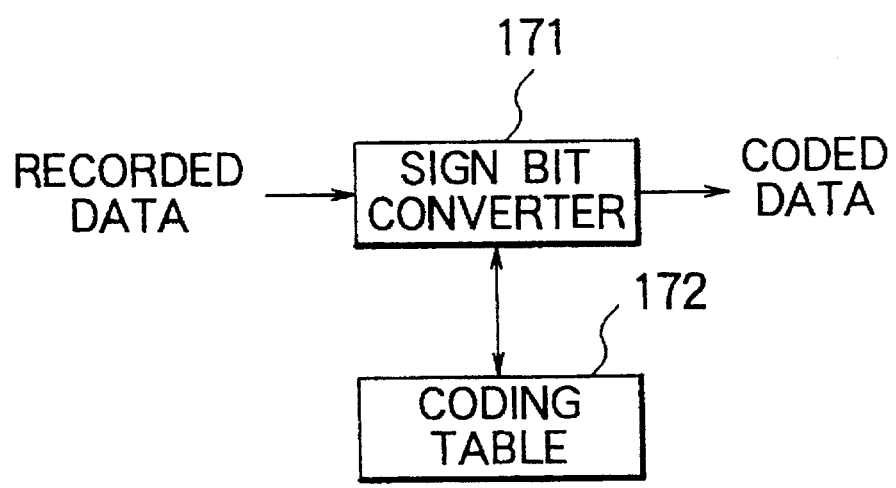
FIG. 22A is a block diagram of the encoder of an information recording/reproduction apparatus.
Figure 23:
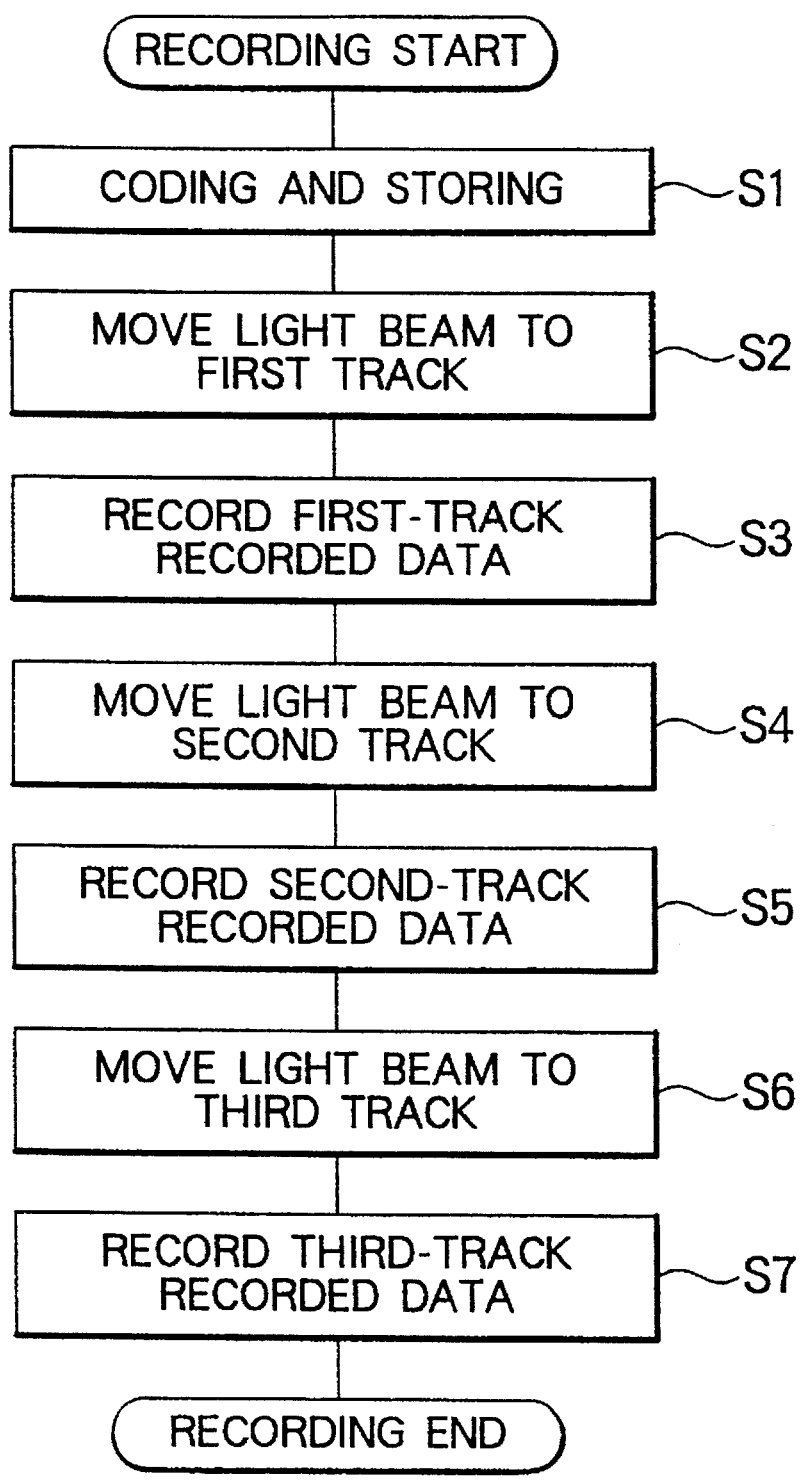
FIG. 23 is a flowchart showing the information recording method of the first embodiment of the present invention.

FIG. 23 shows a flowchart for when information is recorded in FIG. 22. In FIG. 23, information bits (record data) are input to an encoder, where coding is performed for the three tracks, and modulation bits (code bits or code words) are temporarily stored in a buffer memory (step S1). A light beam is them moved to the first track (step S2) and modulation bits to be recorded on the first track are output from the buffer memory and recorded on an optical disk (step S8). The light beam is then moved to the second track (step S4) and modulation bits to be recorded on the second track are output from the buffer memory and recorded on the optical disk (step S5). The light beam is then moved to the third track (step S6) and modulation bits to be recorded on the third track are output from the buffer memory and recorded on the optical disk (step S7).

Figure 24:
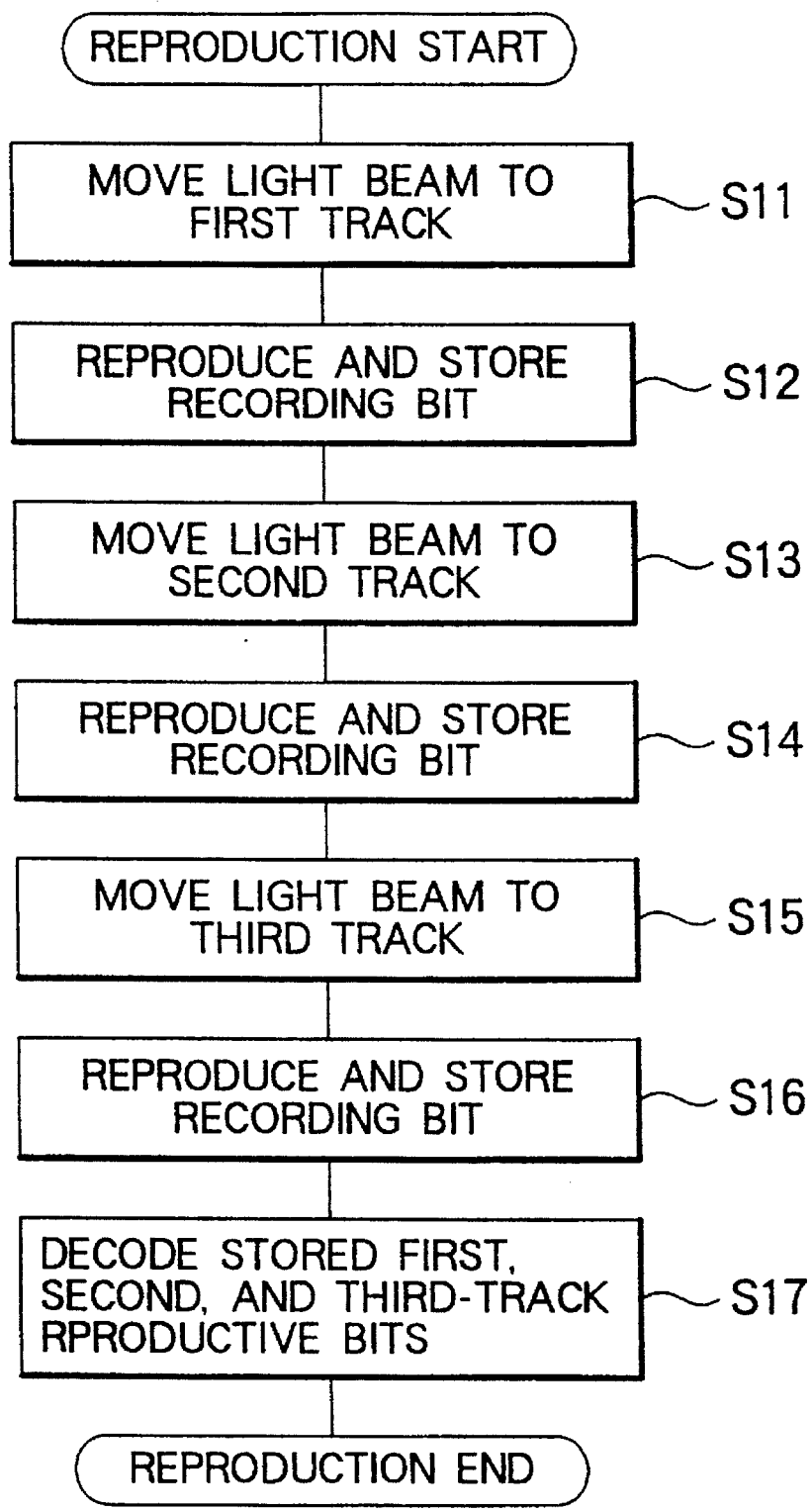
FIG. 24 is a flowchart showing the information reproducing method of the first embodiment of the present invention.

FIG. 24 shows a flowchart for when information is reproduced in FIG. 22. First, a light beam is moved to the first track (step S11) and the record bits recorded on the first track are reproduced and stored in a buffer memory (step S12). The light beam is then moved to the second track (step S13) and the record bits recorded on the second track are reproduced and stored in the buffer memory (step S14). The light beam is then moved to the third track (step S15) and the record bits recorded on the third track are reproduced and stored in the buffer memory (step S16). The reproduction bits stored on the first, second, and third tracks are then input to a decoder to decode information bits (step S17).

The flowchart shows the case of using one light beam. However, when three light beams are used, information can be recorded on or reproduced from the first, second, and third tracks at the same time. Therefore, it is not necessary to move each light beam to its corresponding track or to store information in a buffer memory.

The following first to fifth embodiments relate to the coding method by the encoder 151 in FIG. 22, that is, step S1 in the flowchart in FIG. 23:

The constitution of the encoder 151 is described below by referring to FIG. 22A. The encoder 151 comprises a code bit converter 171 and a coding table 172. The code bit converter 171 converts an information bit to a code bit in accordance with the contents of the coding table.

Other than constructing the encorder by using the coding table, as shown in the above, the encorder may be constructed by a logical operation circuit which directly converts the input information bit into the coded bit.

The first embodiment is described below.

FIG. 1 is a code conversion table used in the first embodiment of the present invention. The table is divided into coding rules for even tracks and those for odd tracks and shows an example of one information bit being converted to three bits. That is, information bits "0 " and "1 " of an even track are converted to "000 " and "010 " in accordance with one set of coding rules while information bits "0 " and "1 " of an odd track are converted to "001 " and "100 " in accordance with the other set of coding rules.

FIG. 2 shows a case of a code bit being recorded on a track in accordance with the above code conversion table. Hereafter, to simplify the description, only so-called NRZ recording is described and "1 " and "0 "are substituted for "record mark" and "nonmark."

Information bit "01 " is converted and recorded on the even track 10. Information bits "01 " and "10 " are converted and recorded on odd tracks 11 and 12. As a result, as shown in FIG. 2, when a code bit read by the even track 10 is "1," the code bits of the odd tracks 11 and 12 horizontally (in a direction perpendicular to a track) adjacent to the above code bit can be set to "0." The same is applied to the code bits of the odd tracks 11 and 12. Therefore, it is possible to provide a coding method causing no read-signal crosstalk.

The second embodiment is described below.

FIG. 3 is a code conversion table used in the second embodiment of the present invention. This table is also divided into coding rules for even tracks and those for odd tracks, which shows a case of two information bits being converted to four code bits. Because other things are the same as those of the first embodiments, a detailed description of them is omitted. When a code bit read by the even track 10 is "1," the code bits of the odd tracks 11 and 12 horizontally (in a direction perpendicular to a track) adjacent to the above code bit can be set to "0." In the case of the above first and second embodiments, because the code bit "0" may continue, it is difficult to synchronize bits by using a phase-locked loop (PLL). In this case, it is possible to avoid the continuation of "0" by adding the additional bit shown in FIG. 4 for each byte.

The third embodiment is described below.

FIG. 3 is a code conversion table used in the third embodiment of the present invention. This table is also divided into coding rules for even tracks and those for odd tracks, which shows a case of three information bits being converted to eight code bits. Among the eight code bits, the last two bits are additional bits for avoiding the continuation of "0."Conversion of four information bits or more in other than the first, second, and third embodiments can be made, in this order, similarly to the cases of the first and second embodiments. Therefore, its detailed description is omitted.

The fourth embodiment is described below.

Figures 4, 5, 6:
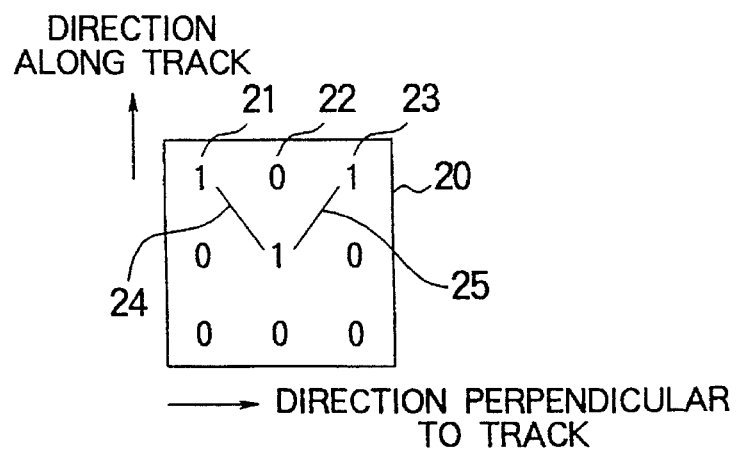
FIG. 4 is an illustration showing additional bits of the code conversion tables in FIGS. 1 and 2.
FIG. 5 is an illustration showing a code conversion table according to the third embodiment of the present invention.
Figure 7:
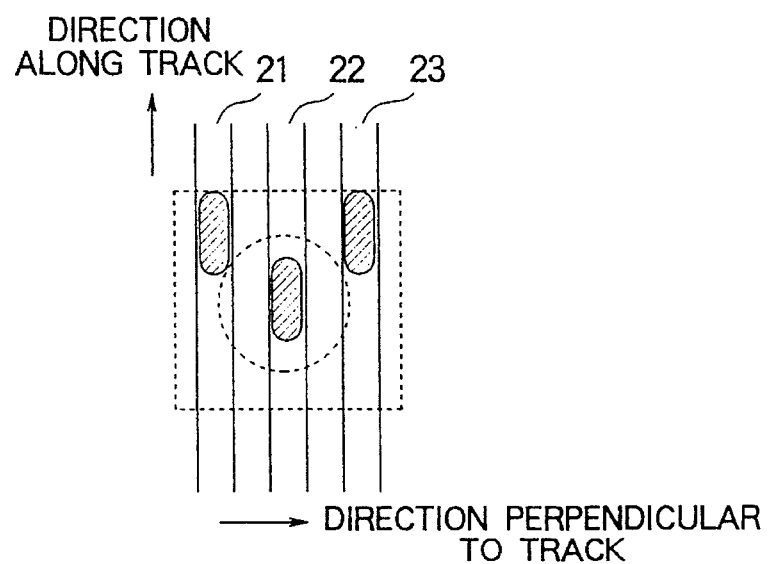
FIG. 7 is an illustration showing code bits recorded in accordance with the code conversion table in FIG. 8.

FIG. 6 is a coding method in the fourth embodiment of the present invention. This method converts one-dimensional information bits before coding into a two-dimensional code-bit matrix $\{C_i, R_j\}$ (i=1, 2, 3: j=1, 2, 3) shown by a 3×3 matrix consisting of three bits along a track and three bits perpendicular to the track. When the matrix element $\{C_i, R_j\}$ is "1," at least one of $\{C_i, R_{j-1}\}$ and $\{C_i, R_{j+1}\}$ is set to "0." For example, the code bit matrix 20 comes to "100 " at the track 21, "010 " at the track 22, and "100 " at the track 23. As shown in FIG. 7, when a code bit read by the track 22 is "1," the code bits of the tracks 21 and 23 vertically adjacent to the above code bit can be set to "0." The same applies to the code bits of the tracks 21 and 23. Therefore, it is possible to provide a coding method causing no read-signal crosstalk.

Figure 8:
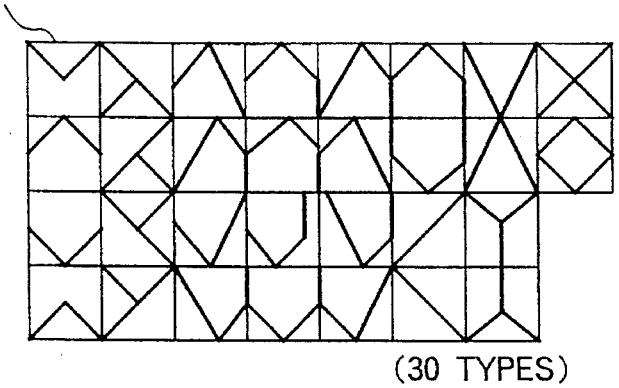
FIG. 8 is an illustration showing a two-dimensional code-bit matrix according to the fourth embodiment of the present invention.

FIG. 6 shows a two-dimensional code-bit matrix. To explain other matrixes in an understandable manner, FIG. 8 shows that "1" and "1" are connected by lines 24 and 25 respectively to express a two-dimensional code-bit matrix by using the geometric pattern of the lines. The two-dimensional code-bit matrix in FIG. 6 is shown as 26 in FIG. 8. These 30 types of pattern of two-dimensional code-bit matrixes are made more understandable by classing them in accordance with point and line symmetry as shown below.

TABLE 1

| 1: Shape of roof (four types) | ∧, ∨, ∧, ∨ |
| 2: Shape of Greek character λ or Japanese character ㅅ (four types) | ㅅ ㅅ ㅅ ㅅ |
| 3: Shape of Japanese character へ (four types) | ヘ, ⌒, ✓, ∨ |
| 4: Shape of house with wall at one side (four types) | ⌐, ⌐, ⌐, ⌐ |
| 5: Shape of poorly formed house (four types) | ∧, ∧, ∨, ∨ |
| 6: Shape of house (two types) | ⌐, ⌐ |
| 7: Shape of slash (two types) | /, \ |
| 8: Shape of V (two types) | V, Λ |
| 9: Shape of Y (two types) | Y, λ |

TABLE 1-continued

| 10: Shape of X (one type) | X |
| 11: Rhombus (one type) | ◊ |

From these geometric patterns, it is visually found that, when a code bit read by the track 22 is "1" the code bits of the tracks 21 and 23 horizontally (in a direction perpendicular to a track) adjacent to the above code bit can be set to "0".

When selecting 16 types out of 30 types of two-dimensional code-bit matrixes, 4 one-dimensional information bits can be converted to these 16 types of two-dimensional code-bit matrixes. The remaining two-dimensional code-bit matrixes can also be used as bit resynchronization patterns.

In the above example, each track includes at least one "1" and one "0" Therefore, the so-called RLL code is realized. That is, it is possible to realize a coding method for simplifying bit synchronization in a PLL circuit.

The description of a two-dimensional code-bit matrix higher than a 3×3 matrix is omitted because the number of code-bit matrixes increases and there are limitations on space.

The fifth embodiment is described below.

Figure 9:
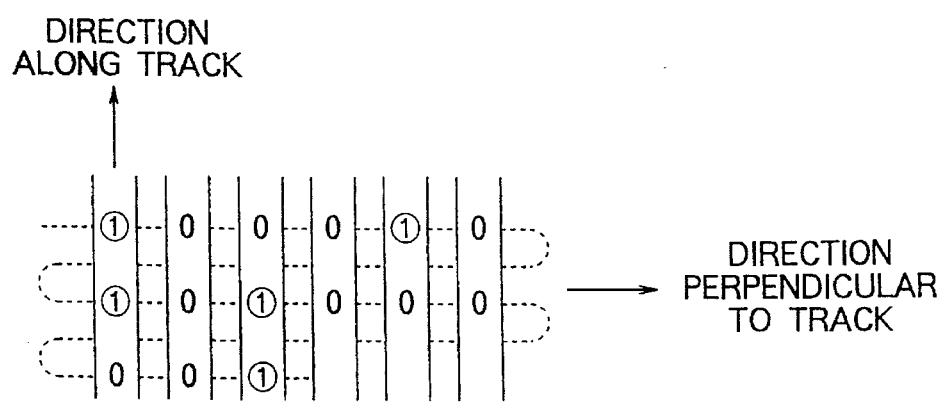
FIG. 9 is an illustration showing the arrangement of code bits according to the fifth embodiment of the present invention.
Figures 12, 13:
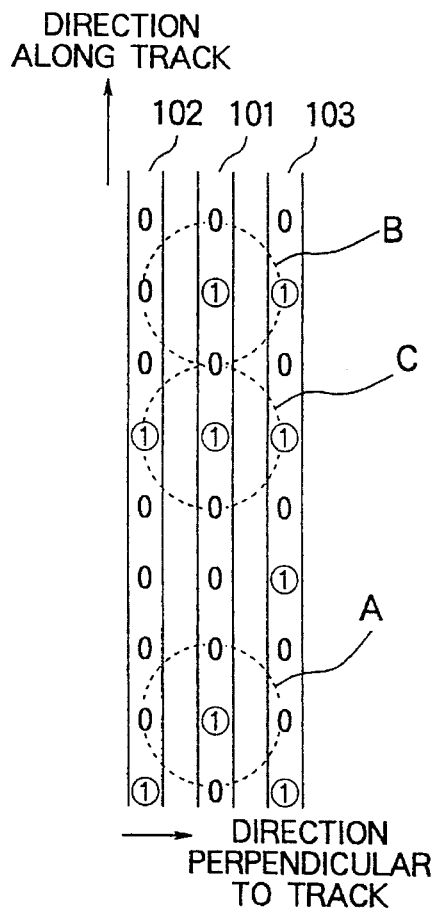
FIG. 12 is an illustration showing an existing code conversion table.
FIG. 13 is an illustration showing code bits recorded in accordance with the code conversion table in FIG. 12.

FIG. 9 is an illustration showing a coding method used in the fifth embodiment of the present invention. This method performs coding in accordance with the existing RLL code conversion table shown in FIG. 12 and thereafter arranges code bits in the direction perpendicular to a track instead of the direction of the track. For example, when information bits are arranged from the top of the code conversion table in order so that they come to "01101100001 . . . ," code bits come to "100010101000001 . . . ." That is, in the case of the (1,7; RLL code in FIG. 12, at least one code bit "0" is put between "1 ." Therefore, it is possible to always set a code bit of a track adjacent to the code bit "1" to "0." Thus, it is possible to provide a coding method causing no read-signal crosstalk, Moreover, the number of tracks in FIG. 9 is 6, which becomes just integer times (1 or 2 times) larger than the code-bit conversion unit (3 or 6 bits). That is, separate coding is realized by determining the number of tracks so that it becomes integer times depending on the type of RLL code.

Even though the (1,7) RLL code is taken as an example in the above description, the same is applicable to other RLL codes.

Moreover, in the case of an optical recording/reproduction apparatus and an optical recording medium, the interval between code bits of adjacent tracks is very small (about 1 to 2 μm and thereby crosstalk occurs easily. However, because the interval is very small, it is easy to synchronize code bits and arrange them adjacently. That is, the present invention serves as an effective coding method, particularly for an optical recording/reproduction apparatus and an optical recording medium.

Moreover, in the above first to fifth embodiments, all code bits of adjacent tracks are synchronized in the direction of the track. This makes it possible to particularly easily record or reproduce information on or from a multibeam recording/reproduction apparatus having a plurality of light beams. That is, because the multibeam recording/reproduction apparatus can fix a plurality of light-beam application positions, it is always possible to record or reproduce synchronized code bits.

Furthermore, only NRZ recording is described above to simplify the description. However, recording is not restricted to NRZ recording. The so-called nonreturn-to-zero-inverted (NRZI) recording also realizes similar coding by expressing code bits to be recorded on tracks with "record mark" and "nonmark."

The multibeam recording/reproduction apparatus of the present invention is described below by taking an optical recording/reproduction apparatus as an example.

Figure 25:
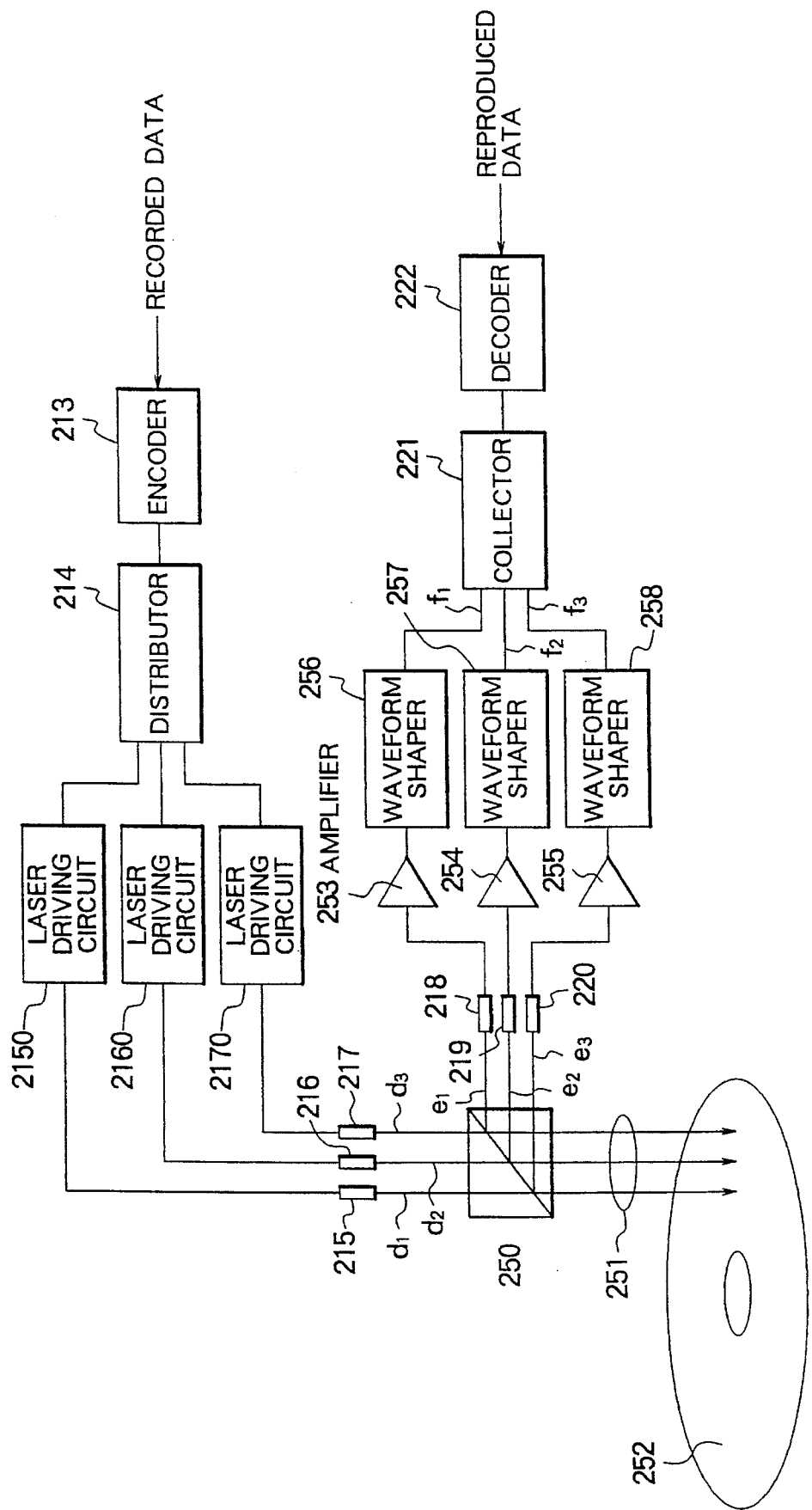
FIG. 25 is a block diagram of the multibeam recording/reproduction apparatus of the sixth embodiment of the present invention.

FIG. 25 is an illustration showing the optical recording/reproduction apparatus of the present invention. When information is recorded, information bits (record data) are input to an encoder 213, encoding is performed, for example, for three tracks, and modulation bits (code words) are sent to a distributor 214. A modulation bit to be recorded on the the first track, a modulation bit to be recorded on the second track, and a modulation bit to be recorded on the third track are output from the distributor 214. These three types of modulation bits are sent to three laser driving circuits 2150, 2160, and 2170. A driving current is sent to semiconductor lasers 215, 216, and 217 from the laser driving circuits 2150, 2160 and 2170, three light beams are applied to an optical disk 252 through a beam splitter 250 and an objective lens 251, and three distributed modulation bits are simultaneously recorded on the disk.

When information is reproduced, three rays reflected from the record bits recorded on the optical disk 252 are led to three photodetectors 218, 219, and 220 by bending the optical path of the three beams with a beam splitter 250 through the objective lens 251. Regeneration signals converted to electric signals are amplified by amplifiers 253, 254, and 255 and converted to a digital signal of "1" or "0" by waveform shapers 256, 257, and 258. A reproduction bit reproduced from the first track, a reproduction bit reproduced from the second track, and a reproduction bit reproduced from the third bit are input to a collector 221 where these bits are unified into one bit. The one unified bit is demodulated as information bits by a decoder 222. In the above description, three light beams are used. In the case of one light beam, however, two buffer memories shown in FIG. 22 are necessary instead of the distributor 214 because information cannot simultaneously be recorded on or reproduced from the first, second, and third tracks.

Figure 26:
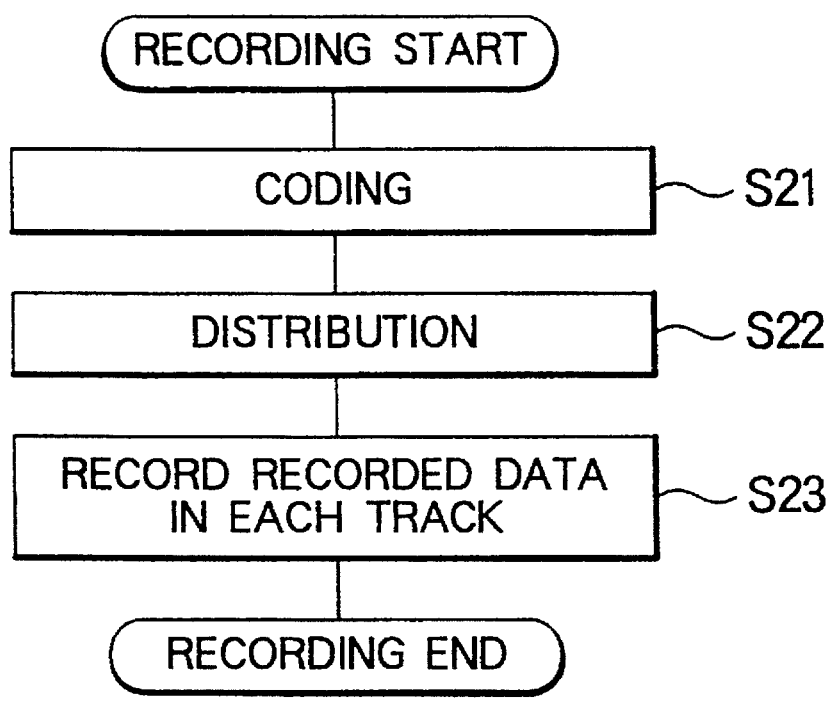
FIG. 26 is a flowchart showing the information recording method of the sixth embodiment of the present invention.

FIG. 26 shows a flowchart for when information is recorded in FIG. 25. Information bits (record data) are input to an encoder and coding is performed, for example, for three tracks (step S21). Modulation bits are distributed to each track (step S22). Then, a modulation bit to be recorded on the first track, a modulation bit to be recorded on the second track, and a modulation bit to be recorded on the third track are recorded on an optical disk by three light beams (step S23).

Figure 27:
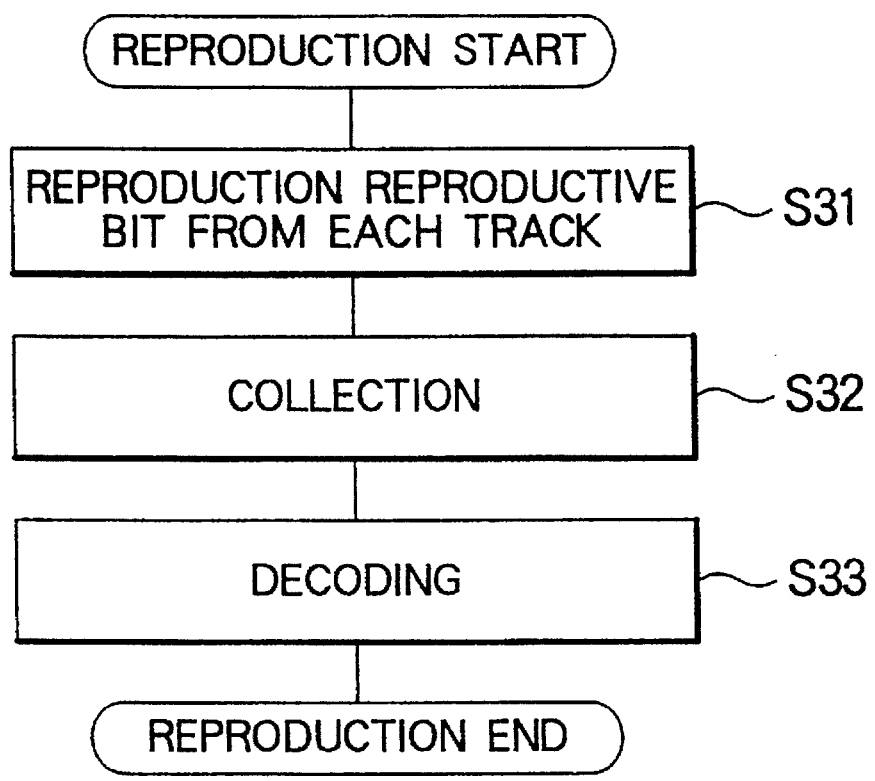
FIG. 27 is a flowchart showing the information reproduction method of the sixth embodiment of the present invention.

FIG. 27 shows a flowchart for when information is reproduced in FIG. 25. A record bit recorded on the first truck, a record bit recorded on the second bit, and a record bit recorded on the third bit are reproduced by three light beams (step S31). The reproduction bit reproduced from the first track, the reproduction bit reproduced from the second track, and the reproduction bit reproduced from the third track are collected by a collector (step S32). Then, the collected reproduction bits are decoded as information bits by a decoder (step S33). The flowchart in FIG. 27 shows a case of using three light beams. In the case of one light beam, however, it is necessary to move each of the light beams to its corresponding track and store information in a buffer memory because information cannot simultaneously be recorded in or reproduced from the first, second, and third tracks.

The following sixth and seventh embodiments mainly relate to the encoder 213, distributor 214, collector 221, and decoder 222 in FIG. 25.

The sixth embodiment is described below.

FIG. 14 shows an information recording method in the sixth embodiment of the present invention. This example shows a case of using three light beams. Light beams 201, 202, and 203 record or reproduce codebits while moving on tracks 207, 208, and 209 in the direction of the arrow A.

FIG. 16 shows a well-known (1, 7) RLL-code conversion table as an example of the coding method. These code bits are recorded on the tracks in FIG. 14. That is, the code bits "100" are first recorded one each on the tracks 207, 208, and 209.

Thus, it is possible to record two information bits "01" in the time used for recording one code bit. In other words, it is possible to record the two information bits with a recording length required for one bit in the direction along a track. Then, by recording the code bits "010" one each on the tracks 207, 208, and 209, it is possible to record the two information bits "10" in the time used for recording one code bit. It is possible to record the code bits "101" and "000001" in the same way. It is also possible to reproduce them in the same way in a short time.

Therefore, high-speed recording or reproduction is realized by recording one word or one byte on a plurality of recording tracks. In this case, the recording or reproduction speed can be increased up to three times as high as the current existing speed.

Thus, by continuing recording, the information recording time for one sector can be shortened inversely proportionally to the number of light beams. In other words, the recording length for one sector in the direction of a track can be decreased.

In the above embodiment, the (1, 7) RLL code, which is a variable length code, is taken as an example. In the case of the 8/10 modulation code, which is a fixed length code, code bits use 10 bits. Therefore, when three light beams are used, separate recording or reproduction is realized by recording information by assuming 30 bits which are the least common multiple as one block.

It is also possible to assume the number of bits integer times as large as 30 bits as one block.

Figure 17:
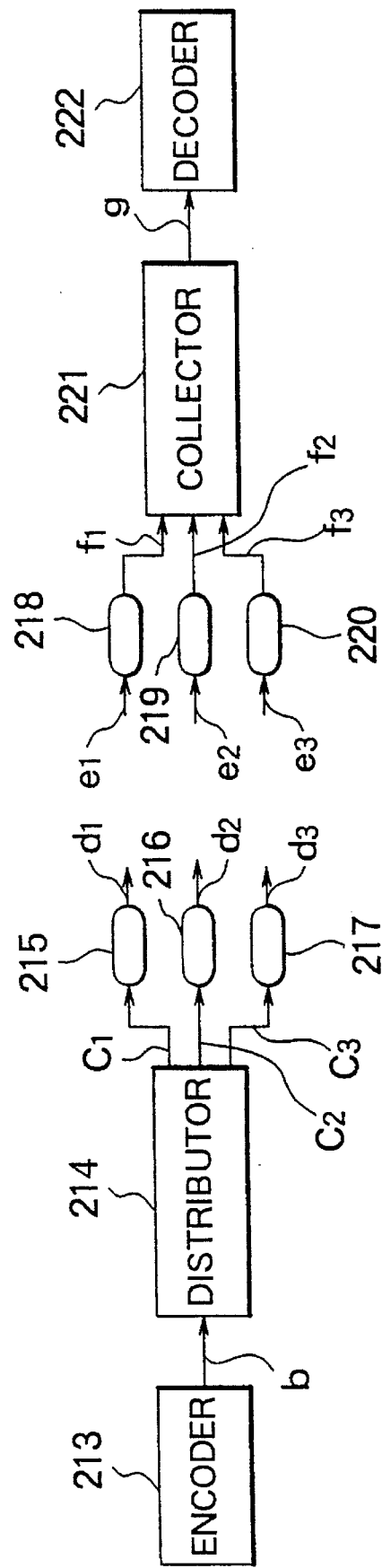
FIG. 17 is a block diagram for realizing the information recording method according to the sixth embodiment of the present invention.

FIG. 17 shows part of the optical recording/reproduction apparatus in FIG. 25.

In FIG. 17, it is possible to code record data by using the encoder 213 when information is recorded, send code bit signal b to the distributor 214, distribute code bit b one each to record bit signals c1, c2, and c3, send them to semiconductor lasers 215, 216, and 217, and record information on a recording medium by using three light beams d1, d2, and 3. When information is reproduced, rays e1, e2, and e3 transmitted or reflected from the recording medium are led to photodiodes 218, 219, and 220, reproduction signals f1, f2, and f3 are led to the collector 221 to collect reproduction bits in the opposite way to that for recording, and reproduction bit signal g is sent to a decoder to decode it as reproduction data.

The distributor 214 in FIG. 17 is described in more detail below by referring to FIG. 18. Sign bit signal b output from the decoder 213 is input to a shift register 223 of the distributor 214. Clock ck1 is input to the shift register 223 and a triple divider 224. The shift register 223 shifts code bit signal b each leading edge of clock ck1. Bit signals h1, h2, and h3 are input to data input terminals D of D-FFs (D-type flip flops) 225, 226, and 227 from three output terminals of the shift register 223. The output ck2 of the triple divider 224 is input to clock input terminals ck of the D-FFs 225, 226 and 227. Record bit signals c1, c2, and c3 are output from output terminals OUT of the D-FFs 225, 226, and 227.

Figure 18:
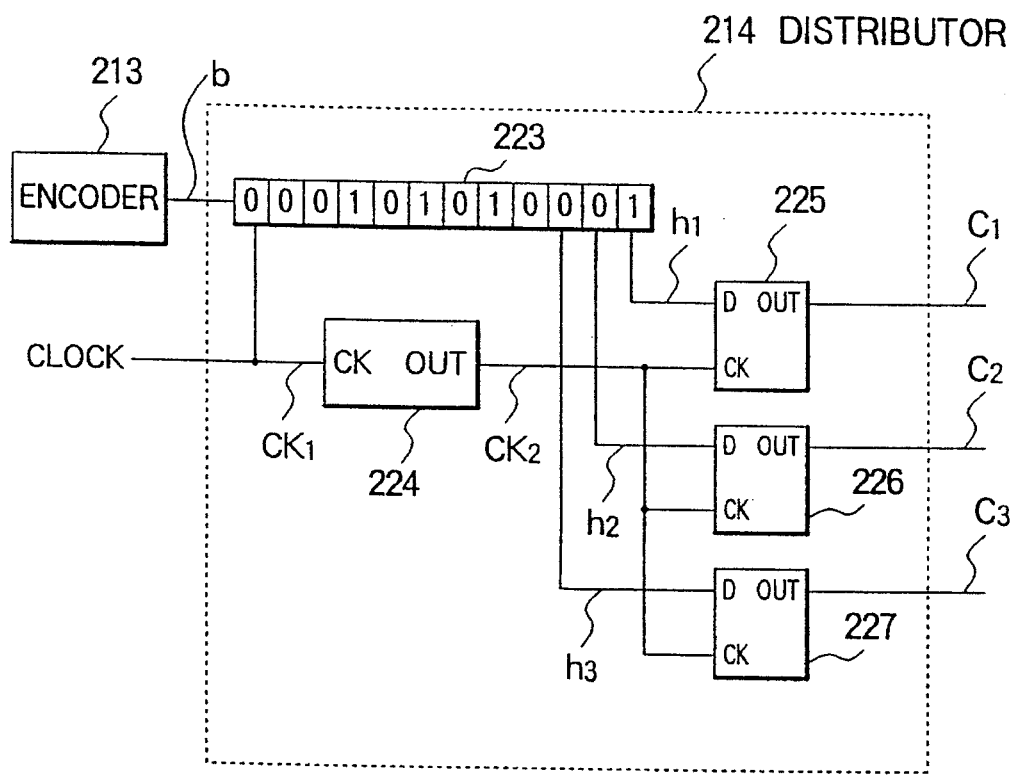
FIG. 18 is an illustration for explaining the distributor in FIG. 17 in detail.
Figure 19:
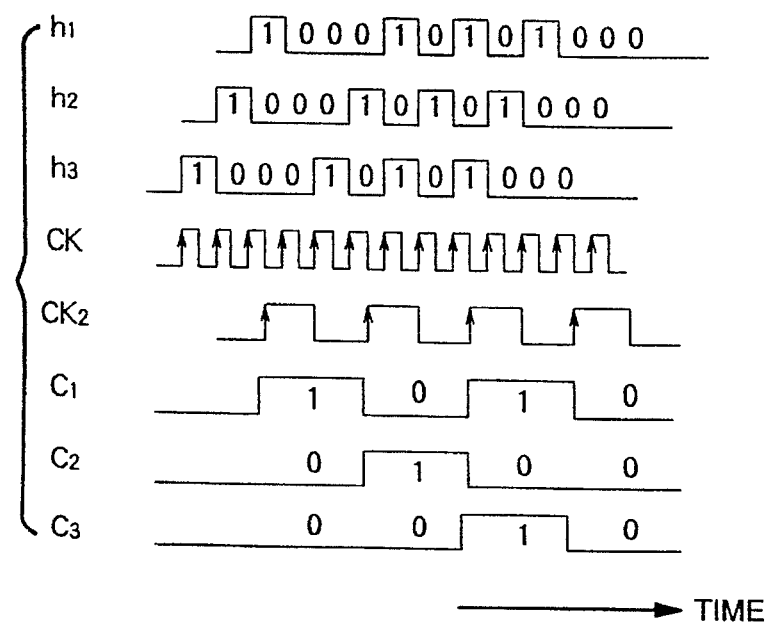
FIG. 19 is an illustration showing the waveforms of various portions of the distributor in FIG. 18.

FIG. 19 shows the waveforms in FIG. 18. Record bit signals c1, c2, and c3 are obtained by latching bit signals h1, h2, and h3 shifted by clock ck1 in the shift register 223 at the leading edge of clock ck2. Record bit signals c1, c2, and c3 are obtained by converting code bit signals b arranged in a series into parallel bits each three bits.

The collector 221 in FIG. 17 is described below in detail by referring to FIG. 20. Regeneration signals f1, f2, and f3 are input to shift registers 228, 229, and 230. Clock ck3 is input to shift register 231 and a triple divider 232. Output signal ck4 of the triple divider 232 is input to the shift registers 228, 229, 230, and 231. The shift registers 228, 229, and 230 shift reproduction bit signals i1, i2, and i3 each very leading edge of clock ck4. The shift register 231 simultaneously incorporates three reproduction bit signals i1, i2, and i3 each leading edge of clock ck4 and shifts them, one bit by one bit, each leading edge of clock ck3. Regeneration bit signal g is transmitted to the decoder 222 from the output terminal of the shift register 31.

Figure 20:
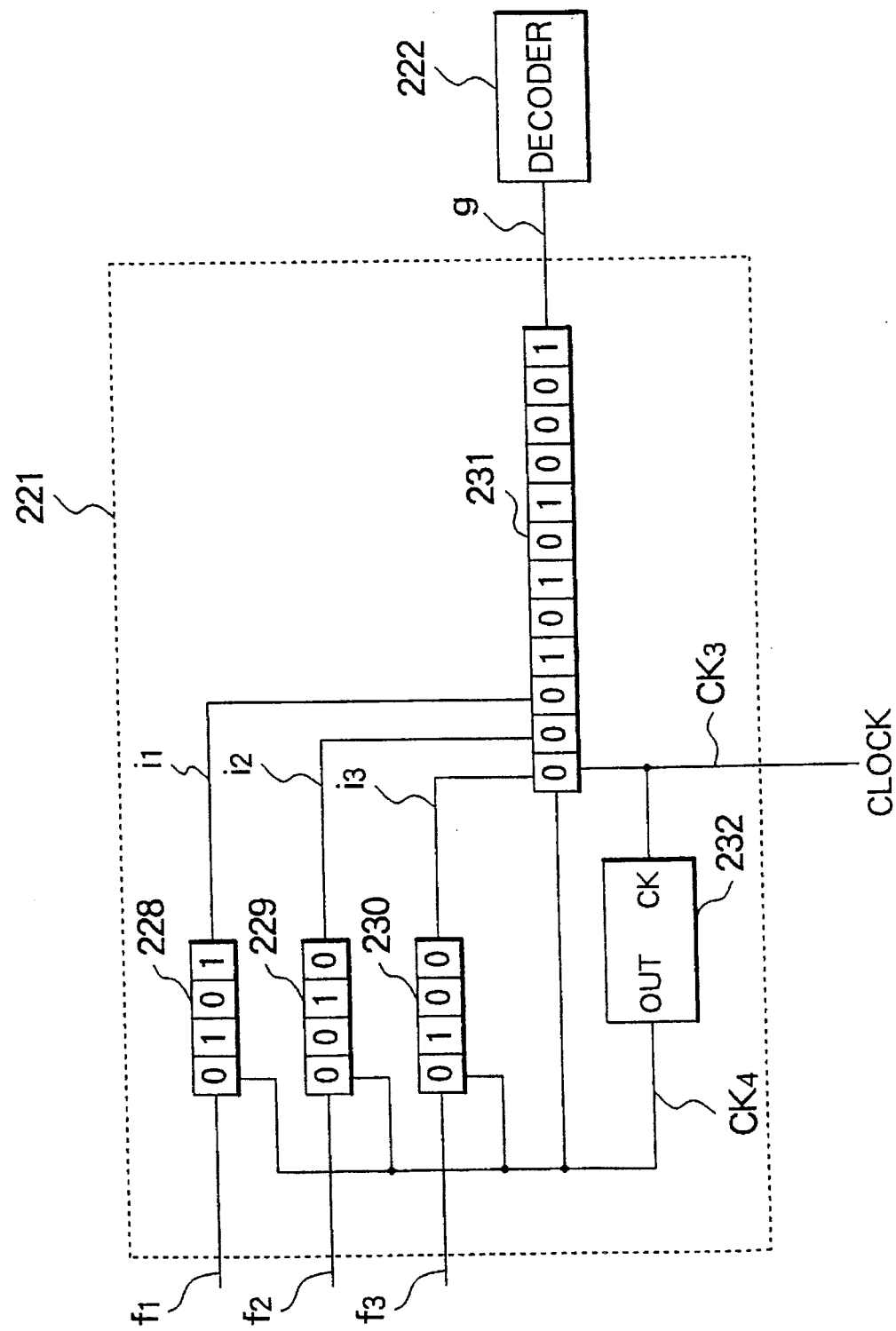
FIG. 20 is an illustration for explaining the collector in FIG. 4 in detail.
Figure 21:
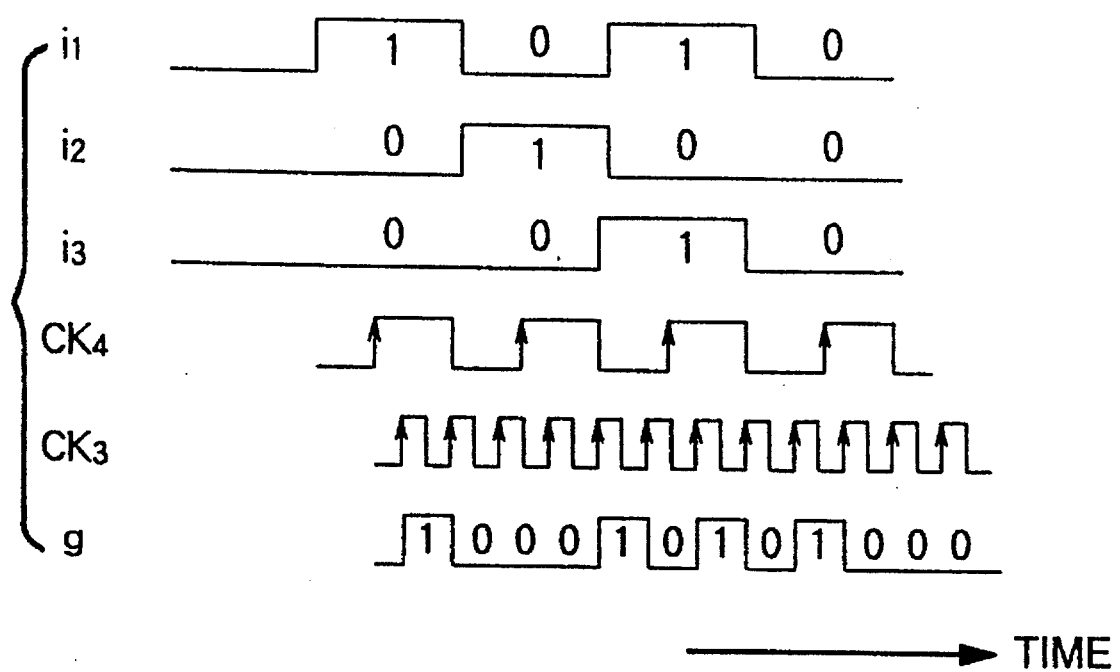
FIG. 21 is an illustration showing the waveforms of various portions of the collector in FIG. 7.

FIG. 21 shows the waveforms in FIG. 20. The shift register 231 simultaneously incorporates reproduction bit signals i1, i2, and i3 each leading edge of clock ck4 and shifts them one bit by one bit each leading edge of clock ck3. Regeneration bit signal g is obtained by converting the reproduction bit signals i1, i2, and i3 arranged in parallel to signals arranged in series each three bits.

The seventh embodiment is described below.

FIG. 15 shows an information recording method used in the seventh embodiment of the present invention. Even though light beams 204, 205, and 206 are not arranged perpendicularly to tracks 210, 211, and 212, other things are the same as those in FIG. 14. Therefore, a detailed description is omitted. If a time lag occurs due to displacement of a light beam, it is necessary to adjust each recording/reproduction time by a value equivalent to the time lag with a delay element and the like. Other things are the same as those in FIG. 14.

Many widely different embodiments of the present invention may be constructed without departing from the spirit and scope of the present invention. It should be understood that the present invention is not limited to the specific embodiments described in the specification, except as defined in the appended claims.

What is claimed is:

1. A coding method for an information recording/reproduction apparatus and a recording medium, comprising the step of setting a second code bit of a second track adjacent to a first code bit of a first track in the direction perpendicular to a track to "0" or "nonmark" when the first code bit of the first track is "1" or "record mark".

2. The coding method according to claim 1, wherein a first coding rule for obtaining a first code bit on an odd track and a second coding rule for obtaining a second code bit on an even track are used and a second bit adjacent to a first bit in the direction perpendicular to a track is set to "0" or "nonmark" by the second coding rule when the first code bit is "1" or "record mark".

3. The coding method according to claim 1, wherein one-dimensional information bits before coding are converted to a two-dimensional code-bit matrix $\{C_i, R_j\}$ ($i=1, \ldots, m; j=1, \ldots, n$) shown by an m×n matrix consisting of m bits in the direction of a track and n bits in the direction perpendicular to the track and, moreover, at least one of $\{C_i, R_{j-1}\}$ and $\{C_i, R_{j+1}\}$ is set to "0" or "nonmark" when the matrix element $\{C_i, R_j\}$ is "1" or "record mark".

4. The coding method according to claim 1, wherein code words having at least one "0" or "nonmark" between the converted "1" or "record mark" and the next "1" or "record mark" are arranged in the direction perpendicular to a track and a second code bit of a second track adjacent to a first code bit of a first track in the direction perpendicular to the track is set to "0" or "nonmark" when the first code bit of the first track is "1" or "record mark".

* * * * *